(12) United States Patent
Cho

(10) Patent No.: US 8,294,176 B2
(45) Date of Patent: Oct. 23, 2012

(54) LIGHT EMITTING APPARATUS, AND METHOD FOR MANUFACTURING THE SAME, AND LIGHTING SYSTEM

(75) Inventor: Bum Chul Cho, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/234,351

(22) Filed: Sep. 16, 2011

(65) Prior Publication Data

US 2012/0007123 A1   Jan. 12, 2012

Related U.S. Application Data

(63) Continuation of application No. 12/720,228, filed on Mar. 9, 2010, now Pat. No. 8,039,865.

(30) Foreign Application Priority Data

Mar. 10, 2009   (KR) .................. 10-2009-0020131

(51) Int. Cl.
  *H01L 33/00*   (2010.01)

(52) U.S. Cl. ............ 257/99; 257/79; 257/544; 257/684; 257/712; 257/E33.075

(58) Field of Classification Search ............ 257/79, 257/99, 544, 551, 684, 712, E33.055, E33.075
See application file for complete search history.

(56) References Cited

U.S. PATENT DOCUMENTS

| | | | |
|---|---|---|---|
| 7,586,125 B2 * | 9/2009 | Dai et al. ................ | 257/81 |
| 7,911,059 B2 | 3/2011 | Cheng et al. | |
| 2005/0274959 A1 | 12/2005 | Kim et al. | |
| 2006/0055012 A1 | 3/2006 | Chen et al. | |
| 2008/0303157 A1 | 12/2008 | Cheng et al. | |
| 2009/0258449 A1 | 10/2009 | Dai et al. | |
| 2010/0187556 A1 | 7/2010 | Kim et al. | |

FOREIGN PATENT DOCUMENTS

| | | |
|---|---|---|
| JP | 20-3128613 U | 12/2006 |
| KR | 10-0616680 B1 | 8/2006 |
| KR | 10-0699146 B1 | 3/2007 |

* cited by examiner

*Primary Examiner* — Eduardo A Rodela

(74) *Attorney, Agent, or Firm* — Birch, Stewart, Kolasch & Birch, LLP

(57) ABSTRACT

A light emitting apparatus includes: a substrate including a first conductive type impurity; a first heatsink and a second heatsink on a first region and a second region of the substrate; second conductive type impurity regions on the substrate and electrically connected to the first heatsink and the second heatsink, respectively; a first electrode electrically connected to the first heatsink on the substrate; a second electrode electrically connected to the second heatsink on the substrate; and a light emitting device electrically connected to the first electrode and the second electrode on the substrate.

18 Claims, 2 Drawing Sheets

LIGHT EMITTING APPARATUS, AND METHOD FOR MANUFACTURING THE SAME, AND LIGHTING SYSTEM

CROSS-REFERENCE TO RELATED APPLICATIONS

The application is a Continuation of application Ser. No. 12/720,228 filed on Mar. 9, 2010 now U.S. Pat. No. 8,039,865, which claims priority under 35 U.S.C. 119 to Korean Patent Application No. 10-2009-0020131 filed on Mar. 10, 2009. The entire contents of all of the above applications are hereby incorporated by reference.

BACKGROUND

Embodiments relate to a light emitting apparatus, a method for manufacturing the same, and a lighting system.

A light emitting diode includes a first conductive type semiconductor layer, an active layer, and a second conductive type semiconductor layer, which are sequentially stacked, so that light generated from the active layer is emitted to the outside according to voltage applied thereto.

The light emitting apparatus may be manufactured in a form that a light emitting device is disposed on a silicon (Si) substrate. Since the Si substrate has a high thermal resistance, thermal emission characteristics may be inferior, and also, light emission characteristics of the light emitting device may be degraded.

In addition, the light emitting apparatus may be damaged by reverse electro static discharge (ESC) that is applied to the light emitting device.

SUMMARY

Embodiments provide a light emitting apparatus having a new structure, a method for manufacturing the same, and a lighting system.

Embodiments provide a light emitting apparatus with improved thermal emission characteristics, a method for manufacturing the same, and a lighting system.

Embodiments provide a light emitting apparatus in which a zener diode that can prevent the light emitting device from damaging by ESD is formed, a method for manufacturing the same, and a lighting system.

In one embodiment, a light emitting apparatus includes: a substrate including a first conductive type impurity; a first heatsink and a second heatsink on a first region and a second region of the substrate; second conductive type impurity regions on the substrate and electrically connected to the first heatsink and the second heatsink, respectively; a first electrode electrically connected to the first heatsink on the substrate; a second electrode electrically connected to the second heatsink on the substrate; and a light emitting device electrically connected to the first electrode and the second electrode on the substrate.

In another embodiment, a method for manufacturing a light emitting apparatus includes: preparing a substrate including a first conductive type impurity; forming second conductive type impurity regions in a first region and a second region of the substrate by etching the substrate; forming a first heatsink and a second heatsink electrically connected to the second conductive type impurity regions on the substrate; forming a first electrode electrically connected to the first heatsink on the substrate; forming a second electrode electrically connected to the second heatsink; and installing a light emitting device electrically connected to the first electrode and the second electrode on the substrate.

In yet another embodiment, an lighting system includes: a circuit substrate; a light emitting apparatus on the circuit substrate; and an optical unit disposed on a light path emitted from the light emitting apparatus, wherein the light emitting apparatus includes: a substrate including a first conductive type impurity; a first heatsink and a second heatsink on a first region and a second region of the substrate; second conductive type impurity regions on the substrate and electrically connected to the first heatsink and the second heatsink, respectively; a first electrode electrically connected to the first heatsink on the substrate; a second electrode electrically connected to the second heatsink on the substrate; and a light emitting device electrically connected to the first electrode and the second electrode on the substrate.

DETAILED DESCRIPTION OF THE EMBODIMENTS

Figure 1:
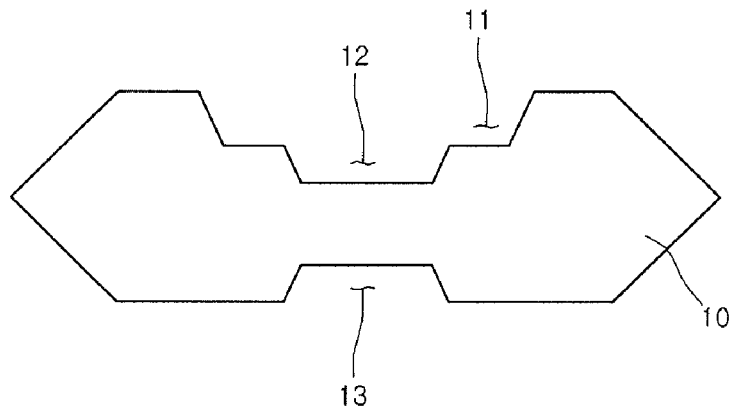
FIGS. 1 to 6 are diagrams for explaining a light emitting apparatus and a method for manufacturing the same according to embodiments.

In describing embodiments, it will be understood that when each layer (or film), region, pattern, or structure is described to as being formed 'on' or 'under' each layer (or film), region, pattern, or structure, "on" or "under" can be formed "directly" or via other layer (indirectly)". In addition, word "on," or "under," are will be described based on the accompanying drawings. In the drawings, the thickness or size of each layer is exaggerated, omitted, or schematically illustrated for convenience in description and clarity. Also, a size of each component does not entirely reflect an actual size.

Hereinafter, a light emitting apparatus according to embodiments will be described in detail with reference to the accompanying drawings.

FIGS. 1 to 6 are diagrams for explaining a light emitting apparatus and a method for manufacturing the same according to embodiments.

Figure 6:
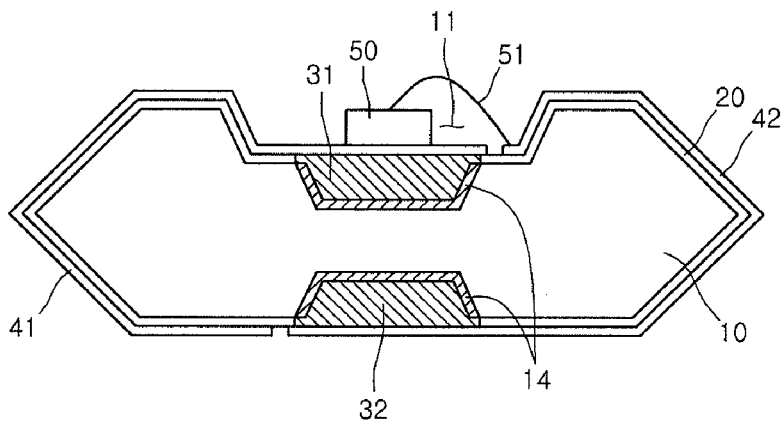

Referring to FIG. 6, a light emitting apparatus includes a substrate 10 that includes a first conductive type impurity, second conductive type impurity regions 14 that are formed on two portions of the substrate 10, an insulating layer that is formed on a surface of the substrate 10, a first heatsink 31 that is formed in a first region of the substrate 10, a second heatsink 32 that is formed in a second region of the substrate 10, a first electrode 41 and a second electrode 42 that are formed on the substrate 10 and are electrically isolated from each other, and a light emitting device 50 that is electrically connected to the first electrode 41 and the second electrode 42.

The substrate 10 may be made of a silicon (Si) material and includes a first conductive type impurity. The upper and lower portions of the substrate 10 are formed with second conductive type impurity regions 14 into which a second conductive type impurity is injected. For example, the first conductive type impurity may be p-type impurity and the second conductive type impurity may be n-type impurity. Further, the first conductive type impurity may be n-type impurity and the second conductive type impurity may be p-type impurity.

The first conductive type impurity may be injected over the substrate 10, or the first conductive type impurity may be selectively injected only between the second conductive type impurity regions 14. When the first conductive type impurity is selectively injected only between the second conductive type impurity regions 14, the insulating layer 20 may not be formed.

The substrate 10 and the second conductive type impurity region 14 form a zener diode that has a p-n-p junction or an n-p-n junction.

The surface of the substrate 10 may be formed with an insulating layer 20 formed of a silicon oxide film in order to prevent current from leaking. The insulating layer 20 may be formed of a silicon nitride film.

The insulating layer 20 is selectively formed on the surface of the substrate 10 so that the second conductive type impurity region 14 can be exposed to the outside for electrical connection.

A first cavity 11 is formed on the upper surface of the substrate 10 and a second cavity (12 of FIG. 1) is under the first cavity 11 so that at least a portion of the first heatsink 31 is buried into the second cavity 12.

A third cavity (13 of FIG. 1) is formed on the lower portion of the substrate 10 so that at least a portion of the second heatsink 32 is buried into the third cavity 13.

The first heatsink 31 and the second heatsink 32 may include a copper (Cu) material with good thermal conductivity as a conductive metal and the first heatsink 31 and the second heatsink 32 are formed at a position corresponding to each other, that is, the first heatsink 31 and the second heatsink 32 are overlapped, thereby making it possible to effectively transferring heat from the first heatsink 31 to the second heatsink 32.

In addition, each of the first heatsink 31 and the second heatsink 32 is electrically connected to the second conductive type impurity region 14.

The first electrode 41 and the second electrode 42 are formed to be extended to the upper surface of the substrate 10 from the lower surface of the substrate 10.

The first electrode 41 and the second electrode 42 may be formed on the insulating layer 20 and a portion of the first electrode 41 is formed to be extended to the first heatsink 31 and a portion of the second electrode 42 is formed to be extended to the second heatsink 32.

Therefore, the first electrode 41 is electrically connected to the second conductive type impurity region 14 that contacts the first heatsink 31 and the second electrode 42 is electrically connected to the second conductive type impurity region 14 that contacts the second heatsink 32.

Further, the first electrode 41 and the second electrode 42 at least partially overlap with each other in a vertical direction.

The light emitting device 50 may be a light emitting diode. The light emitting diode may be designed to have various structures, such as a vertical type light emitting diode, a horizontal type light emitting diode, etc.

The light emitting device 50 is electrically connected to the first electrode 41 and/or the second electrode 42 through a wire 51. The embodiment describes that one side of the light emitting device 50 directly contacts the first electrode 41 to be electrically connected thereto and is electrically connected to the second electrode 42 through the wire 51.

The light emitting device 50 and the zener diode have a circuit configuration that they are connected with each other in parallel.

Therefore, when forward voltage is applied through the first electrode 41 and the second electrode 42, light is emitted from the light emitting device 50 but when reverse ESD voltage is applied to the first electrode 41 and the second electrode 42, current flows through the zener diode such that the light emitting device 50 can be protected from the ESD.

Although not shown, a sealing material (not shown) including phosphor may be filled in the first cavity 11.

Next, a method for manufacturing a light emitting apparatus according to another embodiment will be described with reference to FIGS. 1 to 6.

Referring to FIG. 1, the substrate 10 including the first conductive type impurity is prepared and the upper and lower surfaces of the substrate 1 are etched to form the first cavity 11, the second cavity 12, and the third cavity 13.

Figure 2:
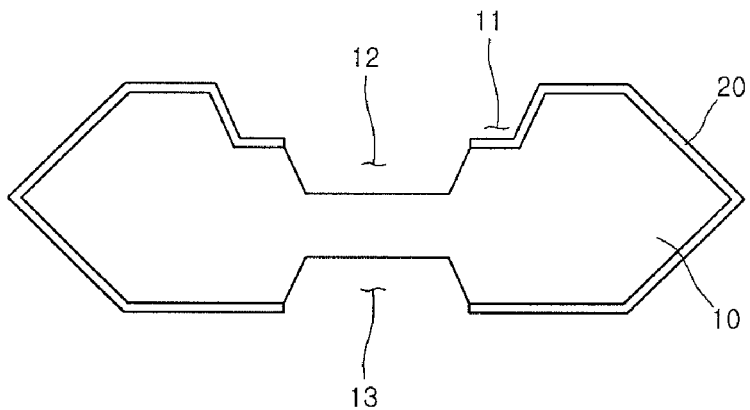

Referring to FIG. 2, the insulating layer 20 is formed on the surface of the substrate 10. The insulating layer 20 may be formed of a silicon oxide film by oxidizing the substrate 10 made of a silicon material. In addition, the insulating layer 20 may be formed of a silicon nitride film by nitrifying the substrate 10 made of a silicon material.

The insulating layer 20 may be selectively formed only in a region other than the second cavity 12 and the third cavity 13.

Figure 3:
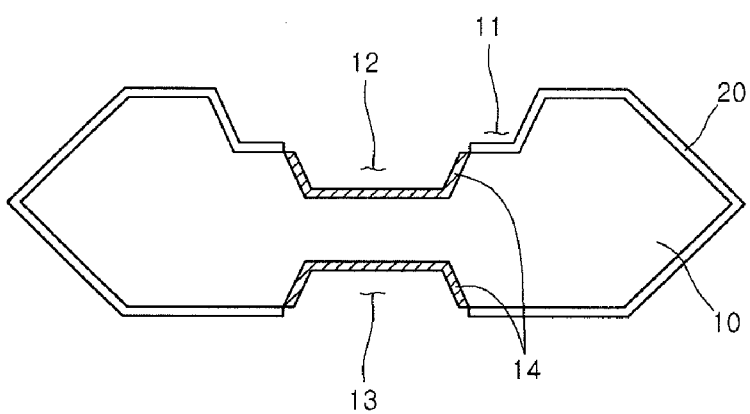

Referring to FIG. 3, the second conductive type impurity is injected into a portion of the substrate 10 on which the second cavity 12 and the third cavity 13 are formed, thereby forming the second conductive type impurity region 14.

Meanwhile, the order of the process of forming the second conductive type impurity region 14 and the process of forming the insulating layer 20 may be reversed.

Figure 4:
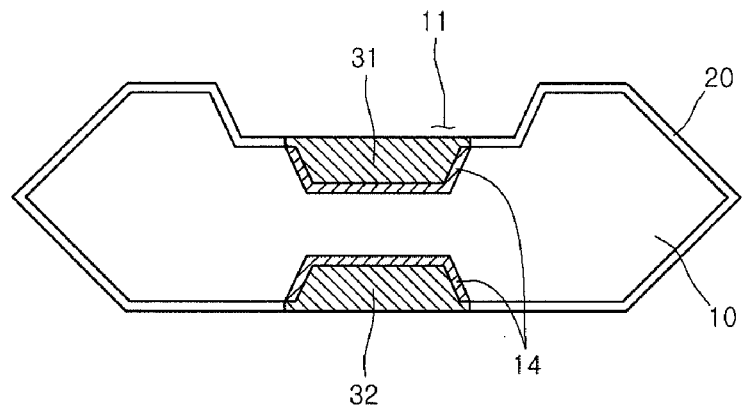

Referring to FIG. 4, the first heatsink 31 and the second heatsink 32 are formed in the second cavity 12 and the third cavity 13.

The first heatsink 31 and the second heatsink 32 may be formed by forming a seed layer in the second cavity 12 and the third cavity 13 and then, performing plating on the seed layer.

Figure 5:
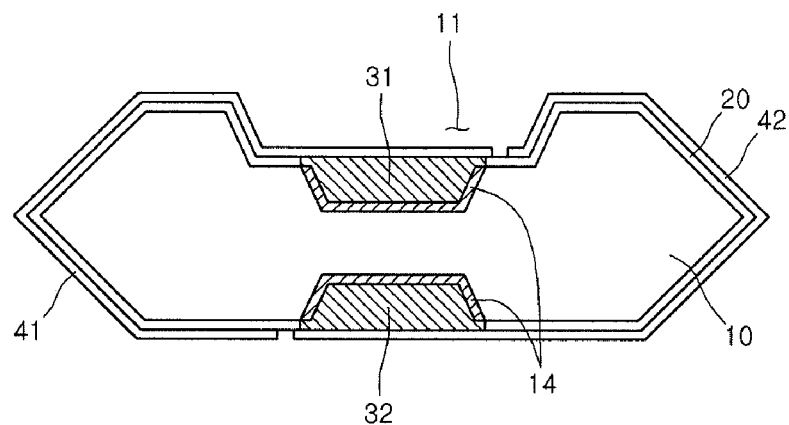

Referring to FIG. 5, the first electrode 41 and the second electrode 42 that are electrically separated from each other are formed on the substrate 10.

The first electrode 41 and the second electrode 42 are extended from the lower surface of the substrate 10 to the upper surface thereof, such that the light emitting apparatus can be easily installed in a surface mounting technology manner.

The first electrode 41 is electrically connected to the first heatsink 31 and the second electrode 42 is electrically connected to the second heatsink 32.

Referring to FIG. 6, the light emitting device 50 is installed on the first electrode 41. The light emitting device and the second electrode 42 are electrically connected to each other through the wire 51.

As described above, the light emitting apparatus and the method for manufacturing the same according to the embodiment forms the second cavity 12 and the third cavity 13 on the substrate 10 and form the first heatsink 31 and the second heatsink 32 made of a metal material, thereby making it possible to rapidly discharge heat emitted from the light emitting device 50 to the outside by using the first heatsink 31 and the second heatsink 32.

Each of the first heatsink 31 and the second heatsink 32 is disposed on and under the substrate 10 and overlaps with each other in a vertical direction, thereby making it possible to effectively transfer heat between the first heatsink 31 and the second heatsink 32.

In addition, the light emitting apparatus and the method for manufacturing the same according to the embodiment can obtain the heat radiation effect as well as perform a role of an electrode that by electrically connecting the first heatsink 31 and the second heatsink 32 to the second conductive type impurity region 14. In particular, since the first heatsink 31 and the second heatsink 32 are formed in the second cavity 12 and the third cavity 13, an area of the first heatsink 31 or the second heatsink 32 contacting with the second conductive type impurity region 14 is increased, thereby more effectively operating the zener diode.

At least one light emitting device 50 or the plurality of light emitting devices may be installed in the light emitting apparatus but the embodiments are not limited thereto.

The light emitting apparatus according to the embodiments may be arrayed on the circuit substrate in plural and a light guide plate, a prism sheet, a diffusion sheet, etc. that are an optical unit, may be disposed on a light path emitted from the light emitting apparatus. The light emitting apparatus, the circuit substrate, and the optical unit can be functioned as the lighting system. In yet another embodiment, the lighting system including the above-mentioned light emitting device or the light emitting apparatus may include, for example, a display apparatus, an indicating apparatus, a lamp, a streetlight. The embodiments may provide the light emitting apparatus having a new structure and the method for manufacturing the same.

The embodiments provide a light emitting apparatus with improved thermal emission characteristics and the method for manufacturing the same.

The embodiments provide the light emitting apparatus in which the zener diode that can prevent the light emitting apparatus from damaging by the ESD is formed and the method for manufacturing the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus, comprising:
a substrate including a first conductive type impurity;
a first heatsink and a second heatsink on a first region and a second region of the substrate;
second conductive type impurity regions on the substrate and electrically connected to the first heatsink and the second heatsink, respectively;
a first electrode electrically connected to the first heatsink on the substrate;
a second electrode electrically connected to the second heatsink on the substrate; and
a light emitting device electrically connected to the first electrode and the second electrode on the substrate,
wherein each of the first heatsink and the second heatsink includes a buried portion, wherein the buried portion is at least partially buried into the substrate, and
wherein the second conductive type impurity regions is disposed between the buried portion and the substrate.

2. The light emitting apparatus according to claim 1, wherein the substrate is a silicon substrate.

3. The light emitting apparatus according to claim 1, further comprising an insulating layer between the substrate and the first electrode and the second electrode.

4. The light emitting apparatus according to claim 3, wherein the insulating layer includes a silicon oxide film or a silicon nitride film.

5. The light emitting apparatus according to claim 1, wherein the first region is disposed on the upper portion of the substrate and the second region is disposed on the lower portion of the substrate.

6. The light emitting apparatus according to claim 5, wherein the first region and the second region overlap with each other.

7. The light emitting apparatus according to claim 1, wherein the first heatsink and the second heatsink include a copper material.

8. The light emitting apparatus according to claim 1, wherein the first heatsink and the second heatsink overlap with each other.

9. The light emitting apparatus according to claim 1, wherein the first heatsink and the second heatsink overlap with the light emitting device.

10. The light emitting apparatus according to claim 1, wherein the lower and side surfaces of the first heatsink contacts the second conductive type impurity region.

11. The light emitting apparatus according to claim 1, wherein the lower and side surfaces of the second heatsink contacts the second conductive type impurity region.

12. The light emitting apparatus according to claim 1, wherein the first electrode and the second electrode at least partially overlap with each other.

13. The light emitting apparatus according to claim 1, wherein the light emitting device directly contacts the first electrode to be electrically connected thereto and the light emitting device is electrically connected to the second electrode through a wire.

14. The light emitting apparatus according to claim 1, wherein the first conductive type impurity is injected between the second conductive type impurity regions.

15. A lighting system, comprising:
a circuit substrate;
a light emitting apparatus on the circuit substrate; and
an optical unit disposed on a light path emitted from the light emitting apparatus,
wherein the light emitting apparatus includes:
a substrate including a first conductive type impurity;
a first heatsink and a second heatsink on a first region and a second region of the substrate;
second conductive type impurity regions on the substrate and electrically connected to the first heatsink and the second heatsink, respectively;
a first electrode electrically connected to the first heatsink on the substrate;
a second electrode electrically connected to the second heatsink on the substrate; and
a light emitting device electrically connected to the first electrode and the second electrode on the substrate,
wherein each of the first heatsink and the second heatsink includes a buried portion, wherein the buried portion is at least partially buried into the substrate, and
wherein the second conductive type impurity regions is disposed between the buried portion and the substrate.

16. The lighting system according to claim 15, wherein the first heatsink and the second heatsink include a copper material.

17. The lighting system according to claim 15, wherein the first heatsink and the second heatsink overlap with each other.

18. The lighting system according to claim 15, wherein the lower and side surfaces of the first heatsink contacts the second conductive type impurity region and wherein the lower and side surfaces of the second heatsink contacts the second conductive type impurity region.

* * * * *